US010462917B2

(12) United States Patent
Lee et al.

(10) Patent No.: US 10,462,917 B2
(45) Date of Patent: Oct. 29, 2019

(54) ELECTRONIC DEVICE AND METHOD FOR MANUFACTURING THE SAME

(71) Applicant: Samsung Electronics Co., Ltd., Suwon-si, Gyeonggi-do (KR)

(72) Inventors: Yong-Seok Lee, Seoul (KR); Tae-Hwan Kang, Gumi-si (KR); Hyun-Jun Kwon, Daegu (KR); Ki-Deuk Kim, Chilgok-gun (KR); Sang-Hyeon Kim, Gumi-si (KR); Jin-A Mock, Suwon-si (KR); Sung-Young Lee, Gumi-si (KR); Min-Su Jung, Seoul (KR); Hong-Moon Chun, Yongin-si (KR); Jung Woong Hyun, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/232,686

(22) Filed: Dec. 26, 2018

(65) Prior Publication Data

US 2019/0132973 A1 May 2, 2019

Related U.S. Application Data

(63) Continuation of application No. 15/457,246, filed on Mar. 13, 2017, now Pat. No. 10,201,102, which is a (Continued)

(30) Foreign Application Priority Data

Aug. 11, 2014 (KR) ........................ 10-2014-0103747

(51) Int. Cl.
*H05K 5/02* (2006.01)
*G06F 1/16* (2006.01)
(Continued)

(52) U.S. Cl.
CPC ......... *H05K 5/0217* (2013.01); *G06F 1/1637* (2013.01); *G06F 1/1658* (2013.01);
(Continued)

(58) Field of Classification Search
CPC combination set(s) only.
See application file for complete search history.

(56) References Cited

U.S. PATENT DOCUMENTS 6,101,088 A * 8/2000 Nakajima ............. G06F 1/1616
312/223.2
6,333,459 B1 * 12/2001 Sato .................... H04M 1/0202
174/377

(Continued)

FOREIGN PATENT DOCUMENTS

CN 102437405 A 5/2012
CN 102904986 A 1/2013
(Continued)

OTHER PUBLICATIONS

Chinese Office Action dated Jun. 4, 2018, issued in the Chinese Application No. 201580043179.1.

*Primary Examiner* — Lisa Lea-Edmonds
(74) *Attorney, Agent, or Firm* — Jefferson IP Law, LLP

(57) ABSTRACT

An electronic device is provided. The electronic device includes a support member including at least a portion formed of a conductive material, an enclosure member configured to receive the support member and including at least a portion of which is formed of a conductive material. The conductive material portion of the enclosure member and the conductive material portion of the support member are insulated from each other.

20 Claims, 15 Drawing Sheets

Related U.S. Application Data continuation of application No. 14/796,514, filed on Jul. 10, 2015, now Pat. No. 9,625,949.

(51) Int. Cl.
  *H04M 1/02* (2006.01)
  *H04M 1/18* (2006.01)
  *H05K 5/00* (2006.01)
  *H05K 7/14* (2006.01)

(52) U.S. Cl.
  CPC ....... *H04M 1/0202* (2013.01); *H04M 1/0277* (2013.01); *H04M 1/185* (2013.01); *H05K 5/0017* (2013.01); *H05K 5/0247* (2013.01); *H05K 7/1427* (2013.01)

(56) References Cited

U.S. PATENT DOCUMENTS

| | | | |
|---|---|---|---|
| 6,388,870 B1 | 5/2002 | Canova, Jr. et al. | |
| 6,501,019 B2* | 12/2002 | Sato | H04M 1/0202 174/377 |
| 6,532,152 B1* | 3/2003 | White | G02F 1/133308 361/692 |
| 8,233,282 B2 | 7/2012 | Chen et al. | |
| 8,355,760 B2 | 1/2013 | Kim | |
| 8,861,198 B1 | 10/2014 | Asuncion | |
| 9,264,090 B2 | 2/2016 | Johnson et al. | |
| 9,286,024 B2 | 3/2016 | Becze et al. | |
| 9,362,972 B2 | 6/2016 | Johnson et al. | |
| 2009/0017263 A1 | 1/2009 | Yeates | |
| 2010/0202623 A1* | 8/2010 | Snider | H04B 1/082 381/58 |
| 2012/0050114 A1 | 3/2012 | Li et al. | |
| 2012/0175165 A1* | 7/2012 | Merz | G06F 1/1656 174/520 |
| 2013/0027892 A1* | 1/2013 | Lim | H04M 1/185 361/748 |
| 2013/0050911 A1 | 2/2013 | Jarvis | |
| 2014/0085836 A1 | 3/2014 | Mo et al. | |
| 2015/0288053 A1* | 10/2015 | Saxe | H01Q 1/243 343/702 |
| 2015/0349407 A1 | 12/2015 | Nishizaka et al. | |
| 2016/0021998 A1 | 1/2016 | Fathollahi et al. | |
| 2016/0033996 A1 | 2/2016 | Lee et al. | |
| 2016/0044816 A1 | 2/2016 | Jarvis et al. | |
| 2019/0132973 A1* | 5/2019 | Lee | H04M 1/0202 |

FOREIGN PATENT DOCUMENTS

| | | |
|---|---|---|
| CN | 102970846 A | 3/2013 |
| EP | 1 919 267 A1 | 5/2008 |
| EP | 2 552 086 A2 | 1/2013 |
| JP | 4279174 B2 | 6/2009 |
| JP | 2010-24940 A | 2/2010 |
| JP | 2014-143485 A | 8/2014 |
| KR | 10-0824011 B1 | 4/2008 |
| KR | 20-2010-0002855 U | 3/2010 |
| KR | 10-2012-0020088 A | 3/2012 |
| KR | 10-2014-0042919 A | 4/2014 |
| KR | 10-2014-0061097 A | 5/2014 |
| KR | 10-2014-0092669 A | 7/2014 |

\* cited by examiner

ELECTRONIC DEVICE AND METHOD FOR MANUFACTURING THE SAME

CROSS-REFERENCE TO RELATED APPLICATION(S)

This application is a continuation application of prior application Ser. No. 15/457,246, filed on Mar. 13, 2017, and a continuation of a prior application Ser. No. 14/796,514, filed on Jul. 10, 2015, and claimed the benefit under 35 U.S.C. § 119(a) of a Korean patent application filed in the Korean Intellectual Property Office on Aug. 11, 2014 and assigned Serial number 10-2014-0103747, the entire disclosure of which is hereby incorporated by reference.

TECHNICAL FIELD

The present disclosure relates to an electronic device.

BACKGROUND

Various electronic devices such as home appliances, communication devices, computers, laptop computers, tablet personal computers (PCs), mobile communication terminals, and so forth may include an enclosure or case manufactured using metallic or synthetic resin materials. The metallic material makes the electronic device look sophisticated and provides protection to external shock. The synthetic resin material is light weight and easy to mold such that it may be used to manufacture any shape of electronic devices. To maximize the advantages of the metallic material and the synthetic resin material, both the metallic material and the synthetic resin material may be used in combination to manufacture the enclosure of the electronic device. For example, the body of the enclosure may be manufactured using the synthetic resin material and a frame and/or a decoration manufactured using the metallic material may be coupled to the body of the enclosure to reinforce the strength of the enclosure or to provide an aesthetically elegant exterior of the enclosure. For this reason, when the enclosure of the electronic device is manufactured, the amount of metallic material exposed on the exterior gradually increases.

While the use of the metallic material on the exterior of the electronic device may provide an exterior aesthetic improvement and/or strength reinforcement, the metallic material may exhibit additional undesirable properties.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to electrically insulate an electronic device while providing an aesthetically sophisticated exterior using a metallic material.

In accordance with an aspect of the present disclosure, an electronic device is provided. The electronic device includes a support member having at least a portion formed of a conductive material, and an enclosure member configured to receive the support member. The enclosure member has at least a portion formed of a conductive material. The conductive material portion of the enclosure member and the conductive material portion of the support member are insulated from each other.

The enclosure member (or housing member) may include a conductive material portion (for example, metal) and a non-conductive material portion (for example, synthetic resin) and may be manufactured into one piece by insert molding or may be coupled by assembly.

The non-conductive material portion of the enclosure member may insulate the conductive material portion of the enclosure member from the support member.

In accordance with another aspect of the present disclosure, a method for manufacturing an electronic device is provided. The method includes manufacturing an enclosure member, wherein at least a portion of the enclosure member is formed of a conductive material, manufacturing a support member, wherein at least a portion of the support member is formed of a conductive material, and receiving the support member in the enclosure member such that the conductive material portion of the enclosure member and the conductive material portion of the support member are insulated from each other.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
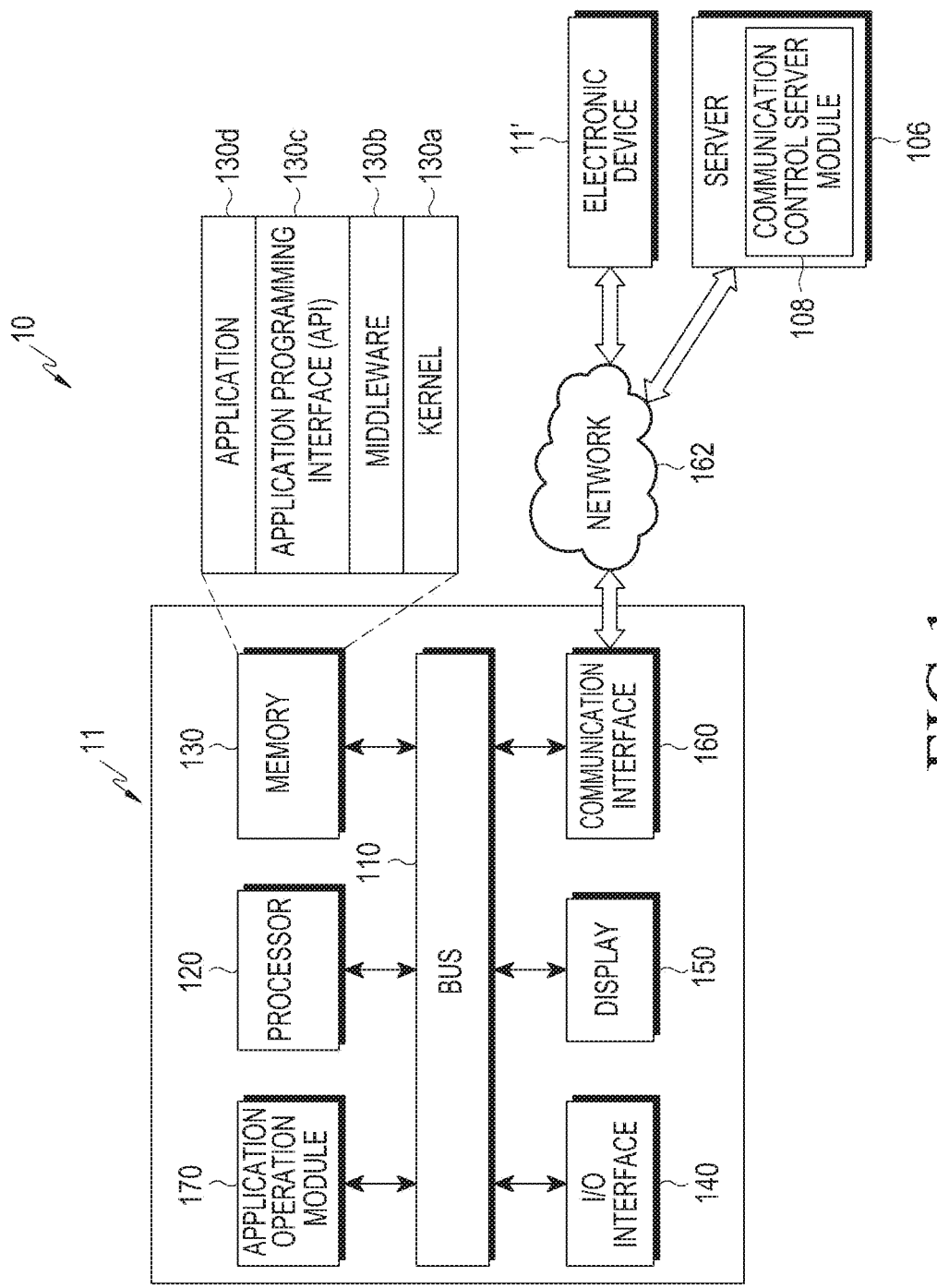
FIG. 1 illustrates a network environment including an electronic device according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular "a," "an," and "the" include plural referents unless the context clearly dictates otherwise. Thus, for example, reference to "a component surface" includes reference to one or more of such surfaces.

Relative terms referred to as illustrated in the drawings, such as a 'front surface', a 'rear surface', a 'top surface', a 'bottom surface', and the like, may be replaced with ordinal numbers such as "first", "second", and so forth. The order of components, such as "first", "second", and so forth, is the order in which they are mentioned or the arbitrarily set order, and thus may be changed arbitrarily. The terms are used for distinguishing one component from another component. For example, a first user device and a second user device are both user devices, and indicate different user devices. Also, a first component may be referred to as a second component and likewise, a second component may also be referred to as a first component, without departing from the teaching of the present disclosure.

Terms used in various embodiments of the present disclosure are intended to describe an embodiment, rather than to limit the various embodiments of the present disclosure. Terms "include" or "may include" used in various embodiments of the present disclosure indicate an existence of disclosed function, operation, or element, but do not limit an existence of one or more other functions, operations, or elements. Terms "include" or "has" used in the present disclosure should be understood that they are intended to indicate an existence of feature, number, operation, element, item or any combination thereof, disclosed in the specification, but should not be understood that they are intended to previously exclude an existence of one or more other features, numbers, operations, elements, or any combination thereof or possibility of adding those things.

Unless otherwise defined, all terms (including technical and scientific terms) used herein have the same meaning as commonly understood by one of ordinary skill in the art to which various embodiments of the present disclosure belong. It will be further understood that terms, such as those defined in commonly used dictionaries, should be interpreted as having a meaning that is consistent with their meaning in the specification with the context of the relevant art as understood by the artisan at the time of disclosure and will not be interpreted in an idealized or overly formal sense unless expressly so defined herein.

In the present disclosure, an electronic device may be an arbitrary device including a touch panel and may be referred to as a terminal, a portable terminal, a mobile terminal, a communication terminal, a portable communication terminal, a portable mobile terminal, a display device, or the like.

For example, the electronic device may be a smart phone, a cellular phone, a navigation system, a game console, a television (TV), a vehicle head unit, a laptop computer, a tablet computer, a personal media player (PMP), a personal digital assistant (PDA), or the like. The electronic device may be implemented as a pocket-size portable communication terminal having a wireless communication function. The electronic device may be a flexible device or a flexible display device.

The electronic device may perform an operation by communicating with an external electronic device such as a server or interworking with the external electronic device. For example, the electronic device may transmit an image captured by a camera and/or position information detected by a sensor unit to the server over the network. The network may be, but not limited to, a mobile or cellular communication network, a local area network (LAN), a wireless LAN (WLAN), a wide area network (WAN), Internet, or a small area network (SAN).

FIG. 1 illustrates a network environment 10 including an electronic device 11 according to various embodiments of the present disclosure.

Referring to FIG. 1, the electronic device 11 may include a bus 110, a processor 120, a memory 130, an input/output (I/O) interface 140, a display 150, and a communication interface 160. In various embodiments of the present disclosure, the electronic device 11 may further include an application operation module 170.

The bus 110 may include a circuit for interconnecting the foregoing components and delivering communication (for example, a control message and/or data) among the components.

The processor 120 may include one or more of a central processing unit (CPU), an application processor (AP), and a communication processor (CP). The processor 120 may receive a command from the foregoing other components (for example, the memory 130, the I/O interface 140, the display 150, the communication interface 160, or the application operation module 170) through the bus 110, interprets the received command, and executes an operation or data processing according to the interpreted command.

The memory 130 may include volatile and/or nonvolatile memory. The memory 130 may store commands or data received from the processor 120 or other components (for example, the I/O interface 140, the display 150, the communication interface 160, or the application operation module 170) or generated by the processor 120 or other components. The memory 130 may include, for example, a kernel 130*a*, middleware 130*b*, an application programming interface (API) 130*c*, and/or an application 130*d*. At least a part of the kernel 130*a*, the middleware 130*b*, and the API 130*c* may be referred to as an operating system (OS). Each of the foregoing programming modules may be configured with software, firmware, or hardware, or a combination thereof.

The kernel 130*a* is configured to control or manage system resources (for example, the bus 110, the processor 120, or the memory 130) used to execute an operation or a function implemented in other programs (for example, the middleware 130*b*, the API 130*c*, or the application 130*d*). The kernel 130*a* provides an interface through which the middleware 130*b*, the API 130*c*, and/or the application 130*d* accesses separate components of the electronic device 11 to control or manage the system resources.

The middleware 130*b* may be configured to function as an intermediary between other elements of the memory 130. For example, middleware 130*b* may allow the API 130*c* or the application 130*d* to exchange data in communication with the kernel 130*a*. In regard to task requests received from the application 130*d*, the middleware 130*b* is configured to control (for example, scheduling or load balancing) with respect to the task requests. For example, the middleware 130*b* may grant at least one of the applications 130*d* priority to use a system resource (for example, the bus 110, the processor 120, or the memory 130) of the electronic device 11.

The API 130*c* is an interface used for the application 130*d* to control a function provided by the kernel 130*a* or the middleware 130*b*, and may include, for example, at least one interface or function (for example, a command) for file control, window control, image processing, and/or character control.

According to various embodiments of the present disclosure, the application 130*d* may include a short message service (SMS)/multimedia messaging service (MMS) application, an e-mail application, a calendar application, an alarm application, a healthcare application (for example, an application for measuring an exercise volume or a blood sugar level), or an environment information application (for example, an application for providing air pressure, humidity, or temperature information). Additionally or alternatively, the application 130*d* may be an application associated with information exchange between the electronic device 11 and the external electronic device 11'. The application associated with information exchange may include a notification relay application for relaying particular information to the external electronic device 11' or a device management application for managing the external electronic device 11'.

For example, the notification relay application may include a function of relaying notification information generated in another application (for example, the SMS/MMS application, the e-mail application, the healthcare management application, and/or the environment information application) of the electronic device 11 to the external electronic device 11'. Additionally or alternatively, the notification relay application may, for example, receive notification information from the external electronic device 11' and provide the notification information to a user. The device management application may manage (for example, install, delete, and/or update) a function of at least a part of the external electronic device 11' communicating with the electronic device 11 (for example, turn-on/turn-off of the external electronic device (or a part thereof) or brightness (or resolution) adjustment of the display), an application operating on the external electronic device 11', or a service (for example, a call service or a message service) provided on the external electronic device 11'.

According to various embodiments of the present disclosure, the application 130*d* may include an application designated according to an attribute (for example, a type) of the external electronic device 11'. For example, if the external electronic device 11' is an MP3 player, the application 130*d* may include an application associated with music playback. Similarly, if the external electronic device 11' is a mobile medical device, the application 130*d* may include an application associated with healthcare. According to various embodiments of the present disclosure, the application 130*d* may include at least one of an application designated in the electronic device 11 and an application received from another electronic device (for example, the server 106 or the external electronic device 11').

The I/O interface 140 serves as an interface for delivering a command or data input from a user or another external device to other component(s) of the electronic device 11. The I/O interface 140 may also output a command or data received from other component(s) of the electronic device 11 to a user or another external device.

The display 150 may include, for example, a liquid crystal display (LCD), a light emitting diode (LED) display, an organic LED (OLED) display, a microelectromechanical system (MEMS) display, or an electronic paper display. The display 150 may display various contents (for example, a text, an image, video, an icon, or a symbol) to users. The display 150 may include a touch screen, and receives a touch, a gesture, proximity, or a hovering input, for example, by using an electronic pen or a part of a body of a user.

The communication interface 160 is configured to establish communication, for example, between the electronic device 11 and an external device (for example, a first external electronic device 11' or a server 106). For example, the communication interface 160 is connected to a network 162 through wireless or wired communication to communicate with the external device 11'.

The wireless communication may use, as a cellular communication protocol, for example, at least one of long term evolution (LTE), LTE-advanced (LTE-A), code division multiple access (CDMA), wideband CDMA (WCDMA), a universal mobile telecommunication system (UMTS), wireless broadband (WiBro), or global system for mobile communications (GSM)). The wired communication may include, for example, at least one of a universal serial bus (USB), a high definition multimedia interface (HDMI), a recommended standard (RS)-232, and a plain old telephone service (POTS). The network 162 may include at least one of a telecommunications network, for example, at least one of a computer network (for example, a LAN or a WAN), Internet, and a telephone network.

According to an embodiment of the present disclosure, the network 162 may be a telecommunications network. The communication network may include at least one of a computer network, the Internet, the Internet of things (e.g., device to device (D2D) communication or machine to machine (M2M) communication), and a telephone network. According to an embodiment of the present disclosure, a protocol (for example, a transport layer protocol, a data link layer protocol, or a physical layer protocol) for communication between the electronic device 11 and an external electronic device (e.g., external electronic device 11' and/or server 106) may be supported in at least one of the application 130d, the API 130c, the middleware 130b, the kernel 130a, and/or the communication interface 160.

According to an embodiment of the present disclosure, the application operation module 170 may support driving of the electronic device 11 by performing at least one of operations (or functions) implemented on the electronic device 11. For example, the server 106 may include a communication control server module 108 configured to support the application operation module 170 implemented on the electronic device 11. The communication control server module 108 may include at least one component of the application operation module 170 to perform at least one of the operations performed by the application operation module 170 (for example, in place of the application operation module 170).

The application operation module 170 processes at least a part of information obtained from other components (for example, the processor 120, the memory 130, the I/O interface 140, or the communication interface 160) and uses the processed part in various ways. For example, using or independently of the processor 120, the application operation module 170 controls at least some functions of the electronic device 11 such that the electronic device 11 interworks with another electronic device (for example, the external electronic device 11' and/or the server 106). The application operation module 170 may be integrated into the processor 120. According to an embodiment of the present disclosure, at least one component of the application operation module 170 may be included in the server 106 (for example, the communication control server module 108), and at least one operations implemented in the application operation module 170 may be supported by the server 106.

Figure 2:
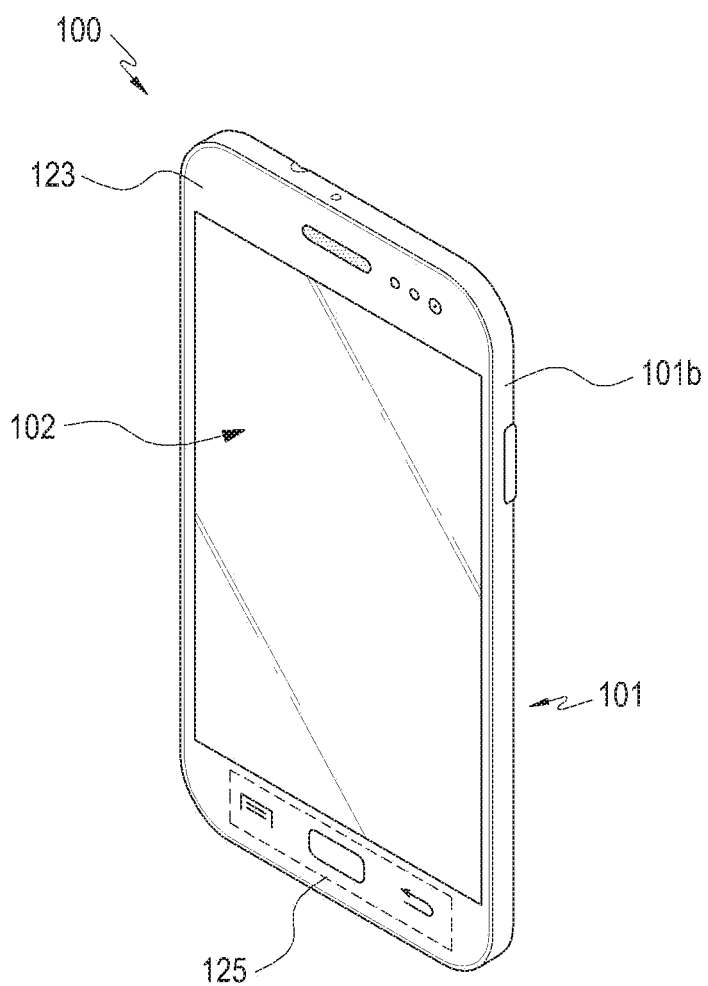
FIG. 2 is a perspective view illustrating an electronic device according to various embodiments of the present disclosure.
Figure 3:
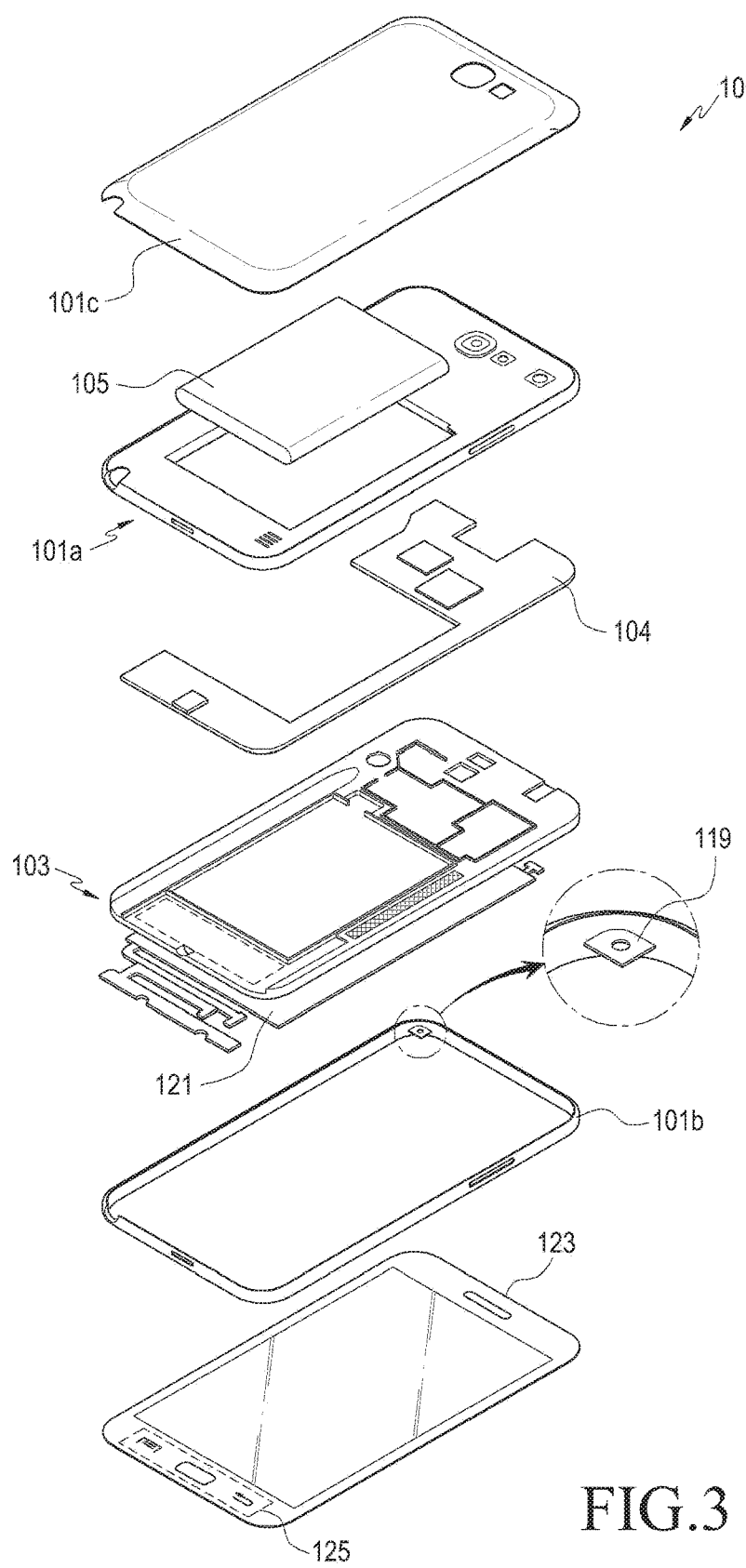
FIG. 3 is an exploded perspective view illustrating an electronic device according to various embodiments of the present disclosure.

FIG. 2 is a perspective view illustrating an electronic device 100 according to various embodiments of the present disclosure. FIG. 3 is an exploded perspective view illustrating the electronic device 100 according to various embodiments of the present disclosure.

Referring to FIGS. 2 and 3, the electronic device 100 (for example, the electronic device 11) may include an enclosure member 101 and a support member 103. In an exemplary embodiment, and at least a portion of the enclosure member 101 and at least a portion of the support member 103 are composed of conductive materials, respectively, where the conductive material of the enclosure member 101 may be insulated from the conductive material of the support member 103.

Figure 4:
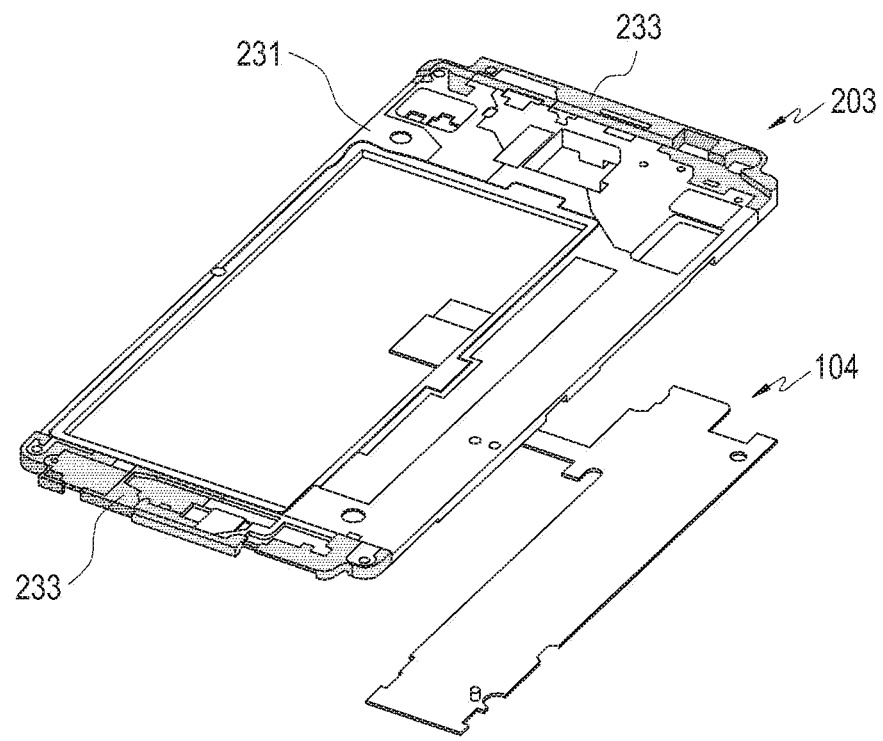
FIG. 4 is an exploded perspective view illustrating an electronic device according to various embodiments of the present disclosure.
Figure 4:
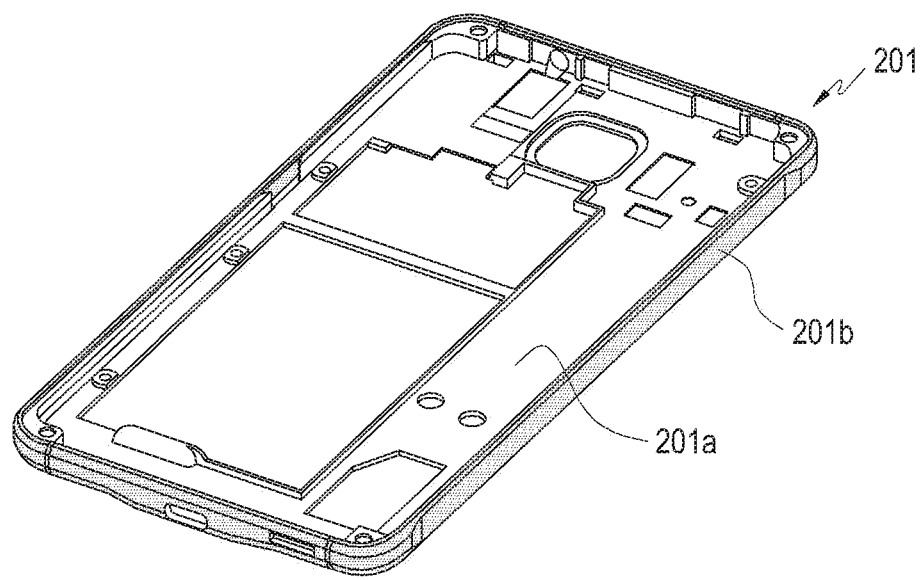

The enclosure member 101 may be formed by coupling a molding enclosure 101a made of a first material, such as a non-conductive material (for example, synthetic resin), and a frame enclosure 101b made of a second material different from the first material, such as a conductive material (for example, metal). For example, the frame enclosure 101b may form a conductive material portion of the enclosure member 101. The molding enclosure 101a and the frame enclosure 101b may be manufactured into one piece by insert or inject molding or each element may be formed individually and coupled during an assembly process. The frame enclosure 101b may be provided to enclose an entire outer surface of the molding enclosure 101a or to surround at least a portion of the outer surface. On an inner surface of the frame enclosure 101b, at least one reinforcement member 119 may be provided. The reinforcement member 119 may protrude from the inner surface of the frame enclosure 101b. In an exemplary embodiment, one or more reinforcement members 119 may protrude from the inner surface of the frame enclosure. For example, while only one reinforcement member 119 is illustrated in FIG. 4, a reinforcement member 119 may protrude from up to the four corners of the frame enclosure 101b. The reinforcement member 119 may prevent the frame enclosure 101b from being bent or twisted by an external force. By forming the reinforcement member 119 at a corner of the frame enclosure 101b rather than in other straight portions, a greater reinforcing effect may be obtained.

As best illustrated in FIG. 2, a front surface of the enclosure member 101 may be open and a display device 102 may be mounted to close the open front surface of the enclosure member 101. As illustrated in FIG. 3, the display device 102 may include a display module 121 (for example, the display 150) for outputting a screen and a window member 123. A touch panel may be integrated into one of the display module 121 and the window member 123 such that the display device 102 may be used not only to output information on a screen, but also to function as an input device. The window member 123 is located in the outermost edge of the display device 102 to protect the display module 121 and to pass the screen output from the display module 121 therethrough. According to various embodiments of the present disclosure, an input key such as a keypad may be disposed on a region 125 of the window member 123.

Referring to FIG. 2, various circuit devices, for example, a circuit board 104 may be provided within the enclosure member 101. Moreover, a support member 103 (for example, a bracket) may be provided inside the enclosure member 101 to reinforce distortional stiffness of the electronic device 100. The support member 103 includes a conductive material portion to provide grounding and shielding of various circuit devices including the circuit board 104, thereby improving operation stability of the electronic device 100. The support member 103 not only reinforces stiffness of the electronic device 100, but also supports the display device 102.

The electronic device 100 may include a battery 105 included in the enclosure member 101, for example, the molding enclosure 101a, and a cover member 101c coupled to a back surface of the molding enclosure 101a to conceal and protect the battery 105. Inside the enclosure member 101, the support member 103 is positioned to face the battery 105. For example, the battery 105 may be surrounded by the molding enclosure 101a, the cover member 101c, and the support member 103. According to various embodiments of the present disclosure, the cover member 101c may be molded into one piece with the molding enclosure 101a and/or the frame enclosure 101b such that the battery 105 may be implemented as an embedded battery that a user cannot directly replace with another one.

The support member 103 is electrically connected with the circuit board 104, for example, by contacting the circuit board 104, to provide grounding and shielding to the circuit board 104. For example, the support member 103 may ground some of circuit devices of the electronic device 100 formed on the circuit board 104 such that when the support member 103 is electrically connected with the frame enclosure 101b, a leakage current may flow from the circuit board 104 to the frame enclosure 101b via the support member 103. According to various embodiments of the present disclosure, the frame enclosure 101b may be insulated from the support member 103 to block leakage current.

For example, even when the reinforcement member 119 protrudes from the inner surface of the frame enclosure 101b, the molding enclosure 101a may be provided to surround the reinforcement member 119 as well as the inner surface of the frame enclosure 101b inside the enclosure member 101. Thus, the frame enclosure 101b may be insulated from internal circuit devices (for example, the circuit board 104) or the support member 103. According to various embodiments of the present disclosure, a portion of the support member 103 may also be formed of a non-conductive material (for example, synthetic resin). For example, in light of an assembly structure, if a portion of the frame enclosure 101b is adjacent to a portion of the support member 103, the portion of the support member 103 which is adjacent to the portion of the frame enclosure 101b may be formed of a synthetic resin material. By forming the portion of the support member 103 adjacent to the portion of the frame enclosure 101b using synthetic resin, a more stable insulating structure may be formed.

Additional embodiments for insulating the conductive material portion (for example, the frame enclosure 101b) of the enclosure member 101 will be described with reference to FIGS. 4 to 15. In the following description of various embodiments of the present disclosure, the same components as those in the preceding embodiments or components that may be easily understood from the preceding embodiments will be given the same reference numerals or omitted, and a detailed description thereof will also be omitted.

Figure 5:
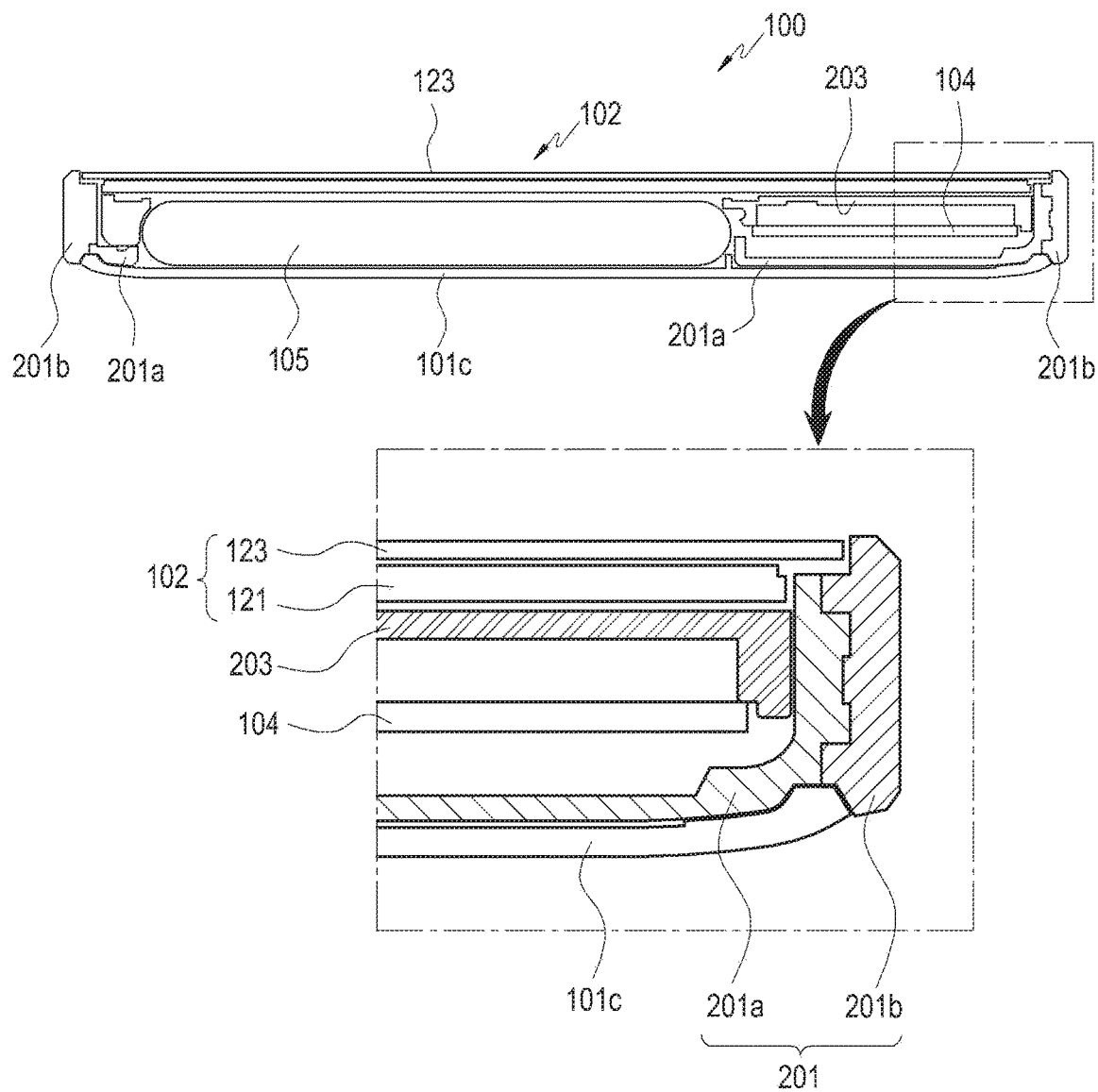
FIG. 5 is a cross-sectional view illustrating an electronic device according to various embodiments of the present disclosure.
Figure 6:
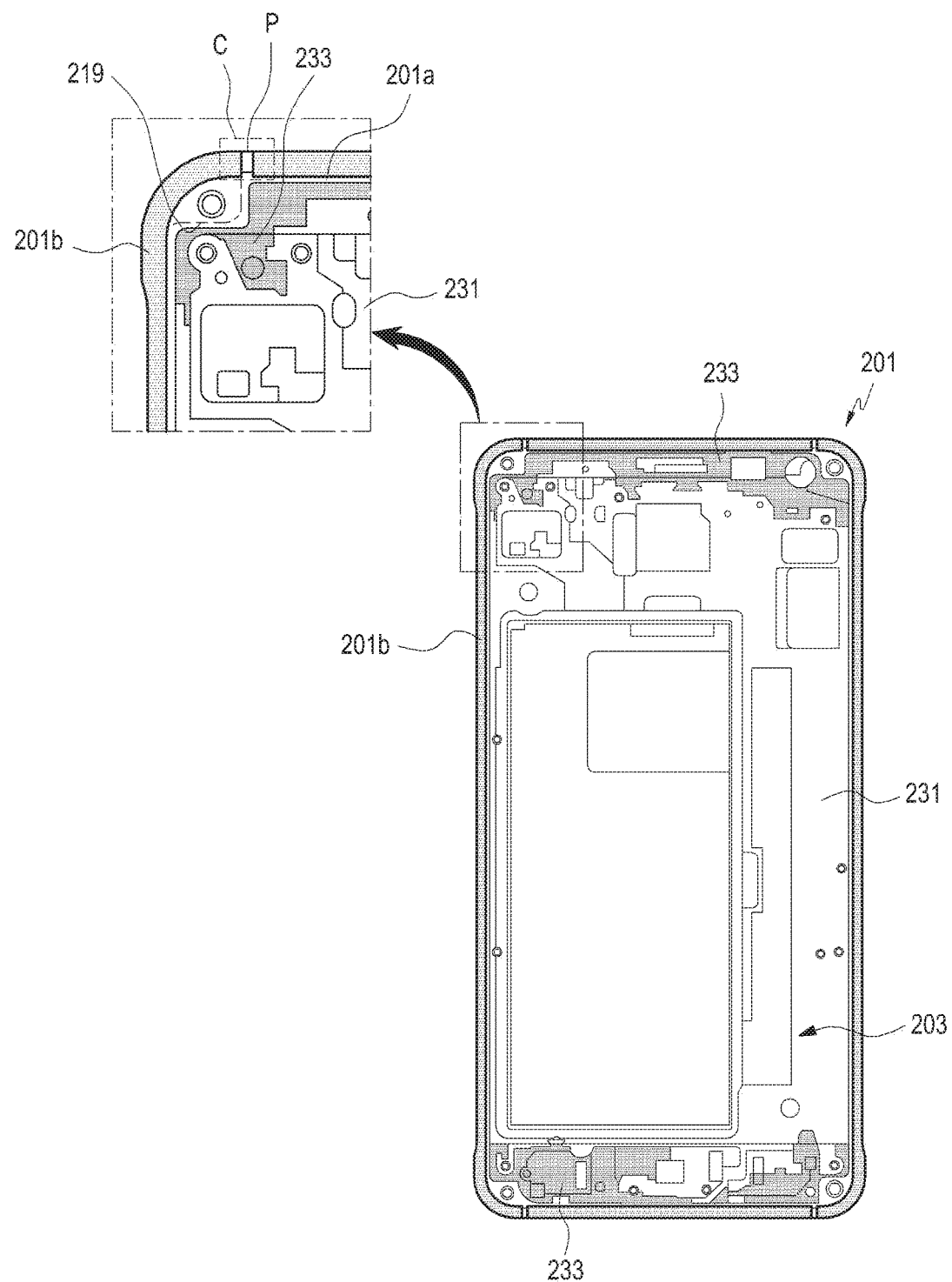
FIG. 6 is a plane view illustrating a portion of an electronic device according to various embodiments of the present disclosure.

FIG. 4 is an exploded perspective view illustrating the electronic device 100 according to various embodiments of the present disclosure. FIG. 5 is a cross-sectional view illustrating the electronic device 100 according to various embodiments of the present disclosure. FIG. 6 is a plane view illustrating a portion of the electronic device 100 according to various embodiments of the present disclosure.

Referring to FIGS. 4 to 6, an enclosure member 201 may include a molding enclosure 201a made of a first material such as a non-conductive material (for example, synthetic resin) and a frame enclosure 201b made of a second material different from the first material such as a conductive material (for example, metal). The frame enclosure 201b may be integrally formed with the molding enclosure 201a by insert or injection molding. Alternatively, the frame enclosure 201b may be formed separately formed from the molding enclosure 201a where the frame enclosure is coupled to the molding enclosure. The frame enclosure 201b couples an outer surface of the molding enclosure 201a in such a way as to surround the outer surface of the molding enclosure 201a, and thus the frame enclosure 201b may be concealed in an inner surface of the molding enclosure 201a. According to various embodiments of the present disclosure, a portion of the frame enclosure 201b may be exposed to the inner side of the enclosure member 201 when a structure for installing the circuit board 104, the support member 203, and various sensor modules is formed in the molding enclosure 201a. Even if the portion of the frame enclosure 201b is exposed to the inner side of the enclosure member 201, the conductive material portion (hereinafter, referred to as a 'first portion 231') of the support member 203 may be sufficiently spaced apart from the portion of the frame enclosure 201b by properly setting a fixed position of the support member 203.

The support member 203 may be formed of a similar conductive material such as metal as the enclosure member 201 to reinforce stiffness of the electronic device 100. When the support member 203 is made of a conductive material, the support member 203 may be electrically connected to the circuit board 104 to provide grounding and shielding. Alternatively, when the enclosure member 201 has sufficient stiffness, the support member 203 may be formed of a second material different from the conductive material such as synthetic resin to reduce the overall weight of the electronic device 100. Even when the support member 203 is formed of a synthetic resin, a conductive layer may be formed on the surface of the support member 203 by coating or deposition to provide grounding and shielding to the circuit board 104.

A 'second portion 233' of the support member 203 may be formed of a non-conductive material such as synthetic resin. For example, in the current embodiment, both ends (for example, a top end and a bottom end) of the support member 203 may be formed of a synthetic resin material, such that the first portion 231 and the second portion 233 may form one body. Since the first portion 231 is made of a conductive material such as metal, the first portion 231 may be coupled to the second portion 233 simultaneously with molding of the second portion 233 by insert or injection molding. Alternatively, the first portion 231 may be formed separately from the second portion 233 where the first portion 231 is coupled to the second portion 233.

According to various embodiments of the present disclosure, the support member 203 may be electrically connected with the circuit board 104 and the frame enclosure 201b may be insulated from the support member 203 to block leakage current. For example, in a portion where the frame enclosure 201b and the support member 203 are likely to contact (for example, an edge of the support member 203 and an inner surface of the frame enclosure 201b adjacent to the edge of the support member 203), the molding enclosure 201a may be interposed between the frame enclosure 201b and the support member 203.

Referring to FIG. 5, it can be seen that a portion of the molding enclosure 201a is interposed between the support member 203 and the frame enclosure 201b. For example, a portion of the molding enclosure 201a adjacent to the edge of the support member 203 is formed by the inner surface of the molding enclosure 201a where the frame enclosure 201b may be positioned outside the portion of the molding enclosure 201a.

Referring to FIG. 6, the reinforcement member 219 may protrude from the inner surface of the frame enclosure 201b. When the molding enclosure 201a is molded, the reinforcement member 219 is enclosed by a material of the molding enclosure 201a and thus may be insulated from the support member 203. However, if an external shock, such as falling, is applied, the four corners of the enclosure member 201 may be prone to damage or deformation. A shock may be concentrated on a smaller area at corners than other portions. If the corners of the enclosure member 201 are damaged or deformed by an external shock, the reinforcement member 219 is exposed to the inside of the enclosure member 201, thus contacting the support member 203. In a typical electronic device, if a reinforcement member contacts a support member, leakage current may flow to a frame enclosure, but the electronic device according to various embodiments of the present disclosure may block such leakage current. For example, even if the reinforcement member 219 contacts the support member 203 due to damage or deformation of the enclosure member 201, a portion of the reinforcement member 219, which contacts the support member 203, is introduced to the second portion 233, thereby preventing the leakage current from flowing to the frame enclosure 201b.

According to various embodiments of the present disclosure, the electronic device 100, for example, the enclosure member 201 may include a segment portion C formed in the frame enclosure 201b and a protruding portion P formed in the molding enclosure 201a. The segment portion C may be in the form of an opening in which a portion of the frame enclosure 201b is removed. The segment portion C is formed such that the frame enclosure 201b may include multiple nodes arranged along an outer circumferential surface of the enclosure member 201. Some of the multiple nodes of the frame enclosure 201b may be connected to the circuit board 104 of the electronic device 100 to provide an electric function (for example, a radiating conductor of an antenna).

The protruding portion P is positioned in the segment portion C such that a portion of the surface of the protruding portion P may form the same surface (a curved surface or a flat surface) as the surface of the frame enclosure 201b. Since the frame enclosure 201b is coupled to the molding enclosure 201a as soon as the molding enclosure 201a is molded, the protruding portion P may also be positioned in the segment portion C simultaneously with molding.

Figure 7:
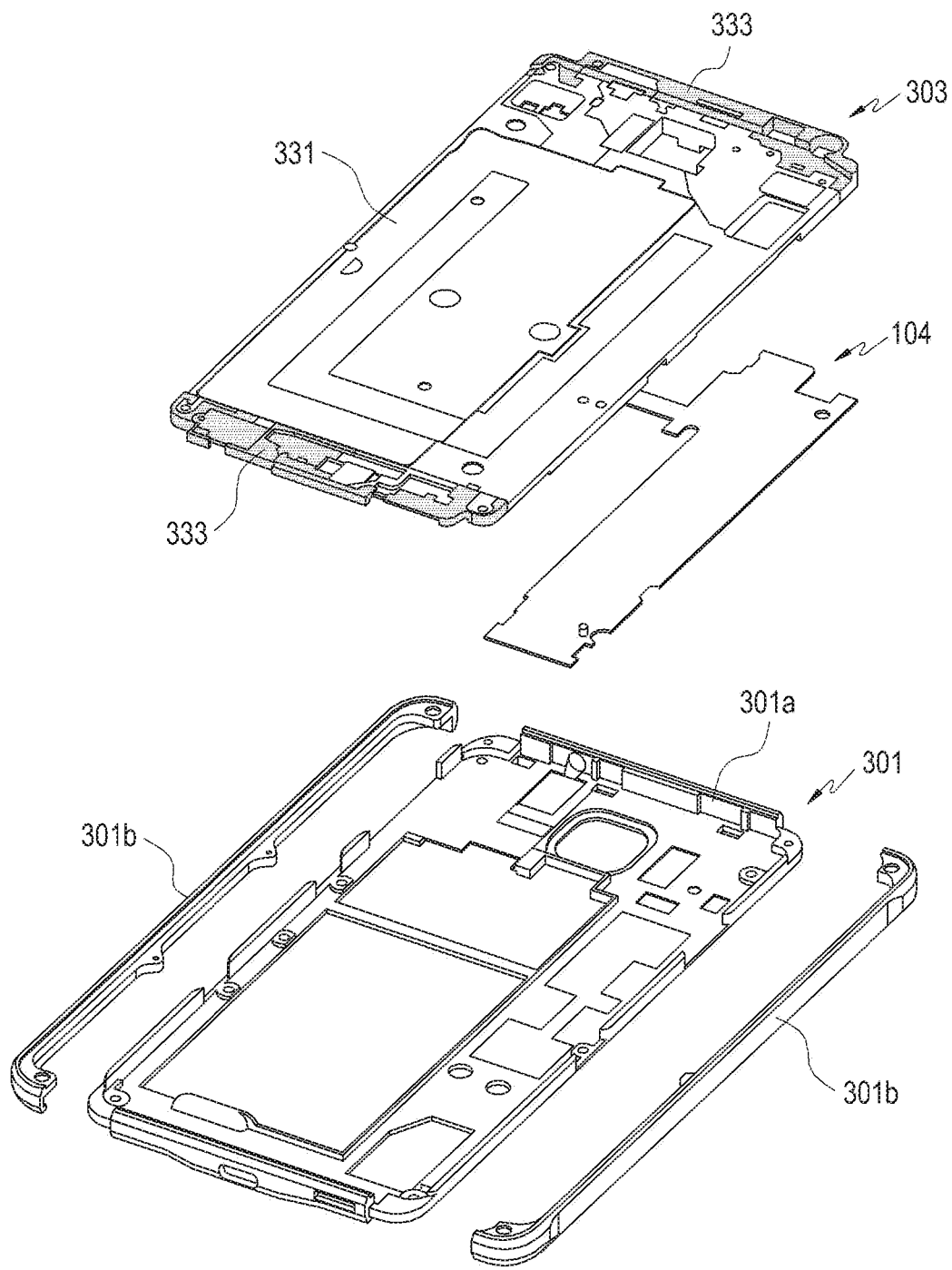
FIG. 7 is an exploded perspective view illustrating a portion of an electronic device according to various embodiments of the present disclosure.
Figure 8:
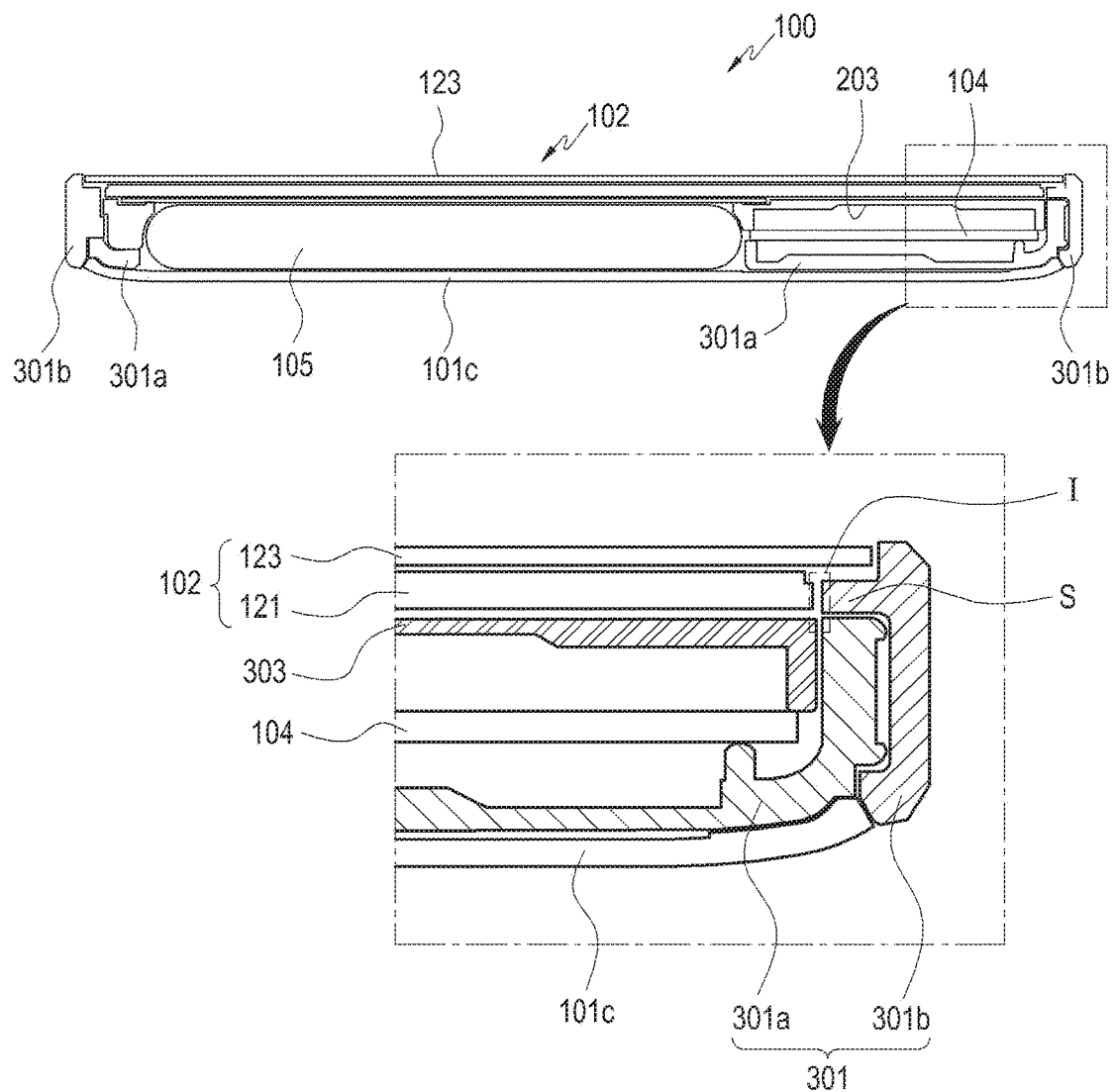
FIG. 8 is a cross-sectional view illustrating a portion of an electronic device according to various embodiments of the present disclosure.
Figure 9:
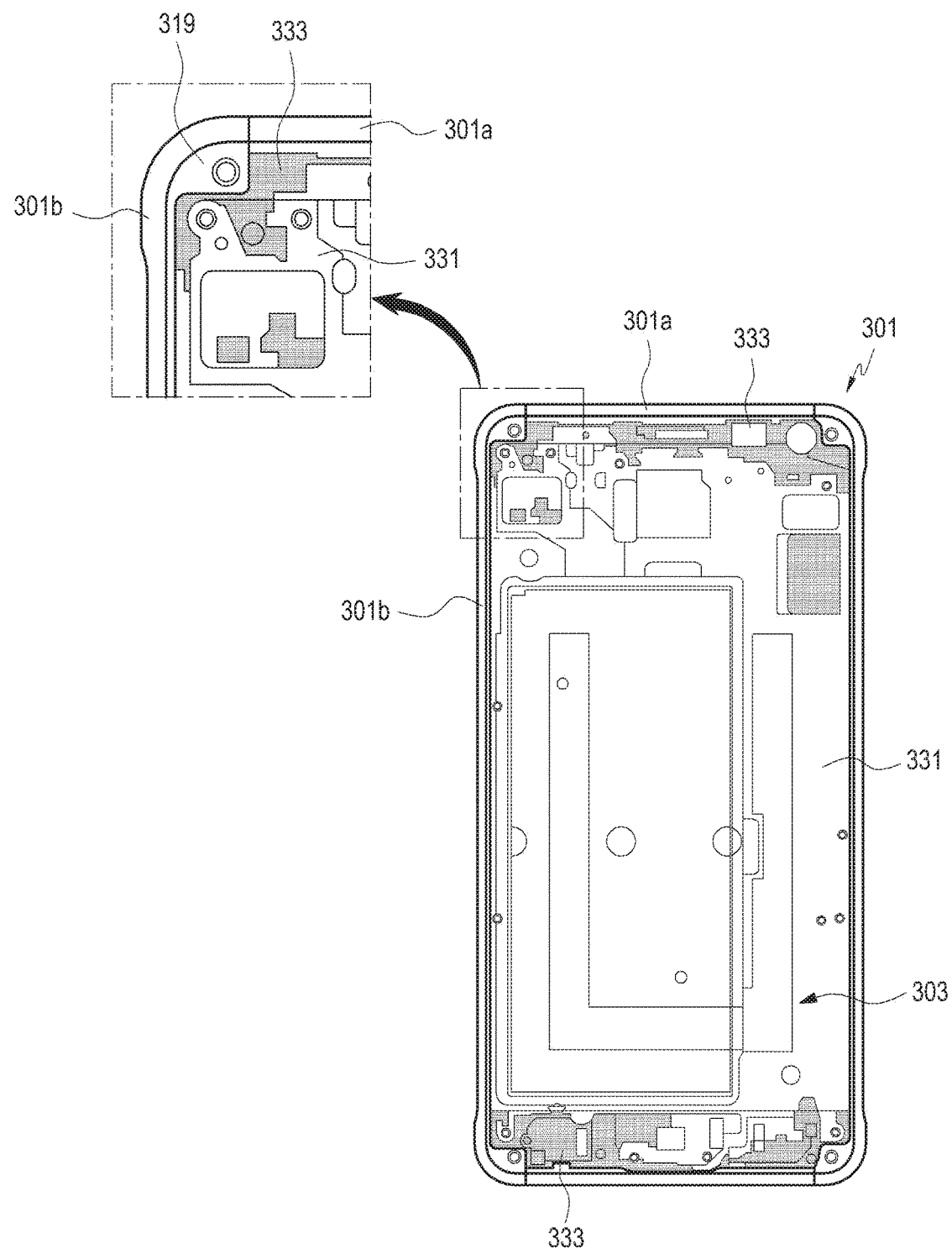
FIG. 9 is a plane view illustrating a portion of an electronic device according to various embodiments of the present disclosure.

FIG. 7 is an exploded perspective view illustrating a portion of the electronic device 100 according to various embodiments of the present disclosure. FIG. 8 is a cross-sectional view illustrating the electronic device 100 according to various embodiments of the present disclosure. FIG. 9 is a plane view illustrating a portion of the electronic device 100 according to various embodiments of the present disclosure.

Referring to FIGS. 7 to 9, an enclosure member 301 may include a molding enclosure 301a formed of a non-conductive material (for example, synthetic resin) and a pair of frame enclosures 301b formed of a conductive material (for example, metal). The frame enclosures 301b may be assembled to the molding enclosure 301a after being manufactured separately from the molding enclosure 301a. The frame enclosures 301b are coupled to both side ends of the molding enclosure 301a, respectively, to partially surround the molding enclosure 301a or partially form a sidewall of the enclosure member 301. The enclosure member 301 may provide a space for receiving or installing the circuit board 104, a support member 303, various sensor modules, and so forth.

The support member 303 may be made of metal to reinforce stiffness of the electronic device 100, for example, the enclosure member 301, and may have conductivity. A conductive material portion of the support member 301 (hereinafter, referred to as a 'first portion 331') may be electrically connected to the circuit board 104 to provide grounding or shielding. Another portion of the support member 303 (hereinafter, referred to as a 'second portion 333') may be formed of a non-conductive material such as synthetic resin. For example, in the current embodiment of the present disclosure, both ends (for example, a top end and a bottom end) of the support member 303 may be formed of a synthetic resin material. Since the first portion 331 is formed of a conductive material such as metal, the first portion 331 may be coupled to the second portion 333 as soon as the second portion 333 is molded by insert molding.

Referring to FIG. 8, the inner surface of the enclosure member 301 is mostly formed by the molding enclosure 301a and is partially formed by the frame enclosure 301b. According to various embodiments of the present disclosure, the frame enclosure 301b is assembled to the molding enclosure 301a, in which to firmly couple the frame enclosure 301b with the molding enclosure 301a. A portion S of the frame enclosure 301b extends in such a way to enclose a top end of a sidewall of the molding enclosure 301a and is positioned in the inner surface of the enclosure member 301. For example, the molding enclosure 301a may be partially interposed between the frame enclosure 301b and the support member 303, and the frame enclosure 301b and the support member 303 may be partially exposed to each other. According to various embodiments of the present disclosure, in a portion where the frame enclosure 301b and the support member 303 are exposed to each other, a sufficient interval I may be secured to prevent the frame enclosure 301b and the support member 303 from being electrically connected to each other.

Referring to FIG. 9, a portion of the conductive material portion (for example, the frame enclosure 301b) of the enclosure member 301 is positioned adjacent to the support member 303. For example, the frame enclosure 301b may include a reinforcement member 319 formed on an inner surface thereof, in which the reinforcement member 319 is positioned in the inner side of the enclosure member 301 adjacent to (or overlappingly with) the support member 303.

If an external shock such as falling is applied to the electronic device 100, the four corners of the enclosure member 301 may be prone to damage or deformation. If the four corners of the enclosure member 301 are damaged or deformed, the reinforcement member 319 may more closely contact the support member 303. According to various embodiments of the present disclosure, when a portion of the reinforcement member 319 contacts the support member 303 due to damage or deformation, the enclosure member 301 is guided to the second portion 333, thereby preventing leakage current from flowing to the frame enclosure 301b.

Figure 10:
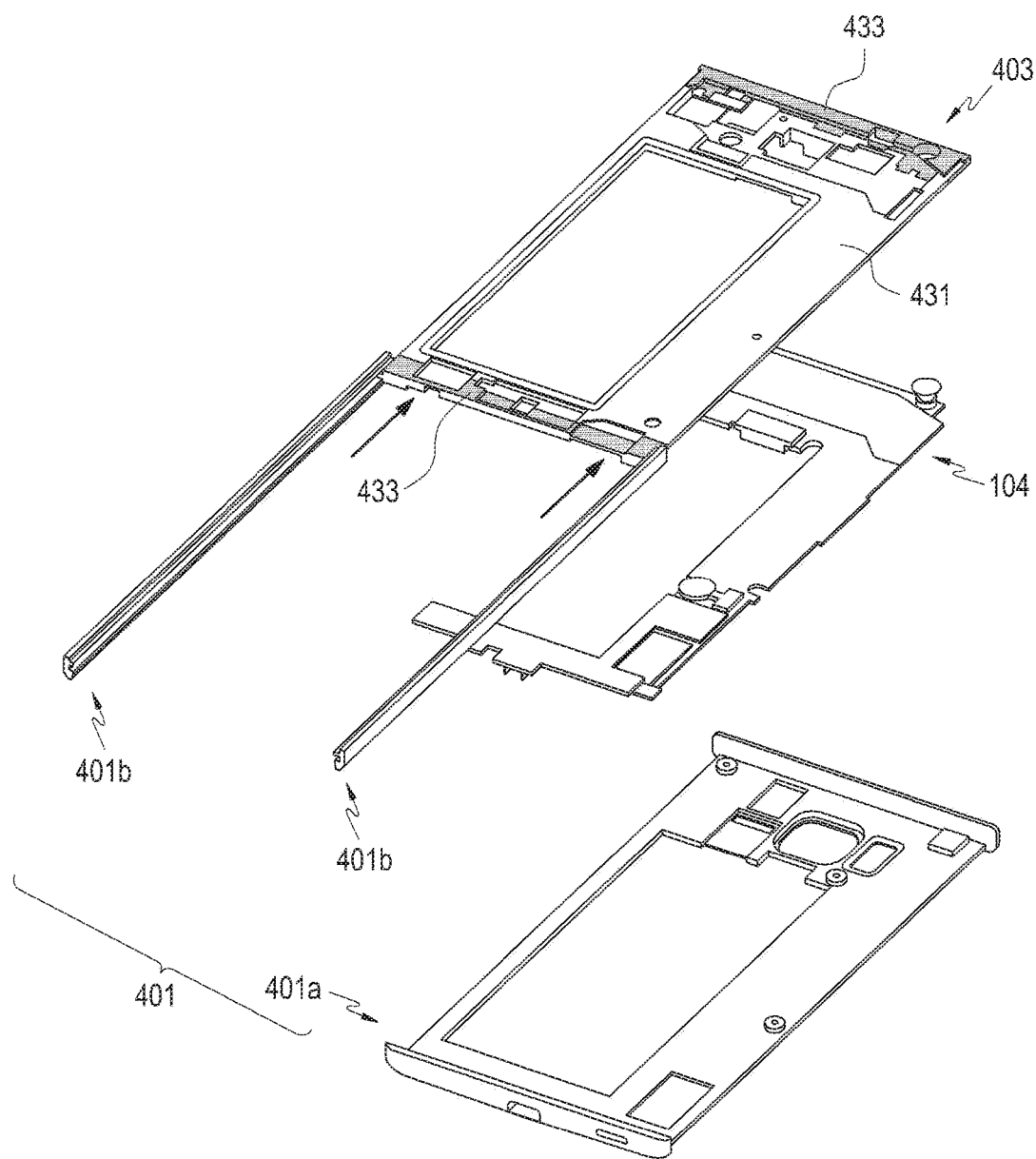
FIG. 10 is an exploded perspective view illustrating a portion of an electronic device according to various embodiments of the present disclosure.
Figure 11:
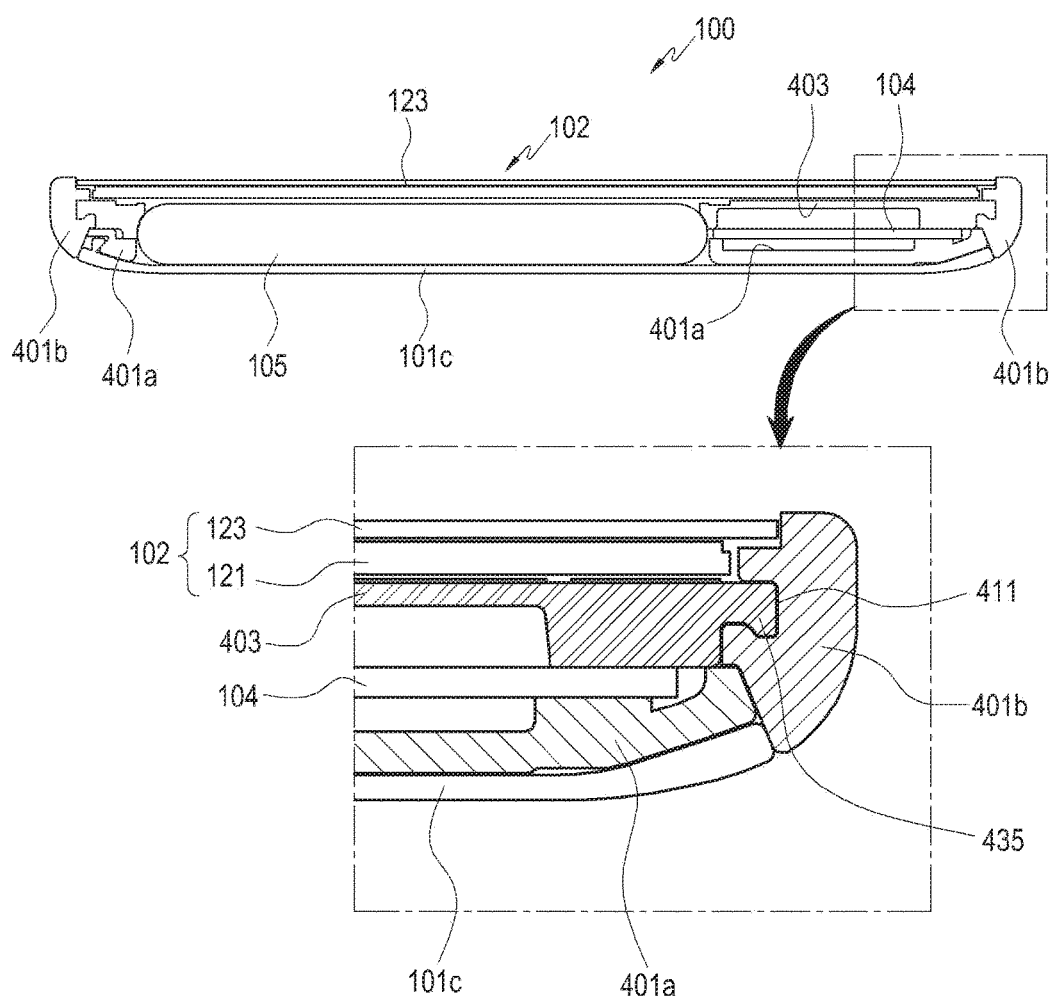
FIG. 11 is a cross-sectional view illustrating a portion of an electronic device according to various embodiments of the present disclosure.
Figure 12:
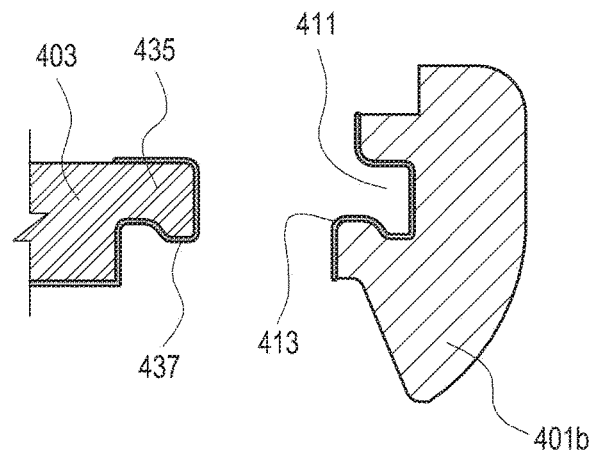
FIG. 12 is an enlarged view illustrating a portion of an electronic device according to various embodiments of the present disclosure.
Figure 13:
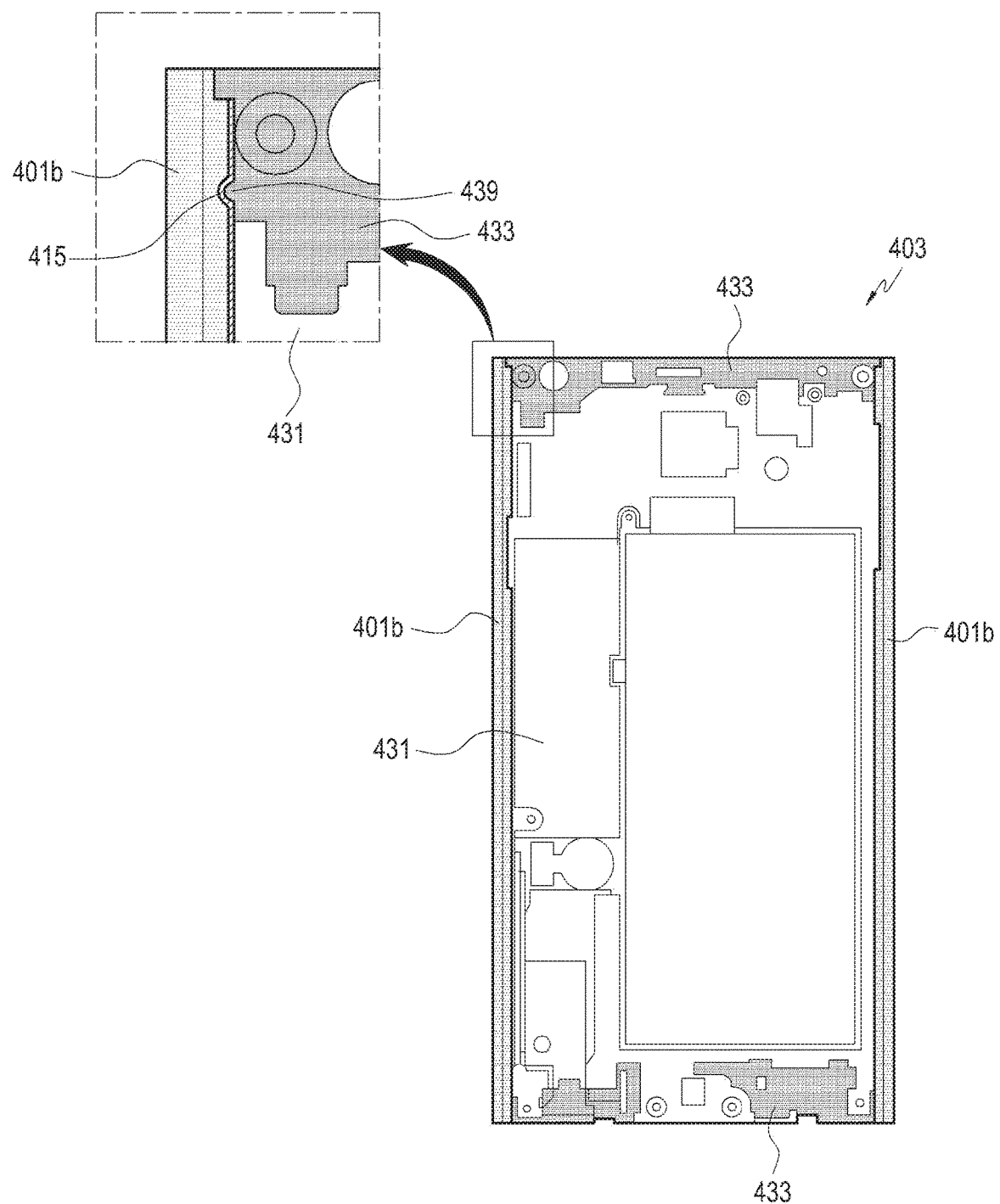
FIG. 13 is a plane view illustrating a portion of an electronic device according to various embodiments of the present disclosure.

FIG. 10 is an exploded perspective view illustrating a portion of the electronic device 100 according to various embodiments of the present disclosure. FIG. 11 is a cross-sectional view illustrating a portion of the electronic device 100 according to various embodiments of the present disclosure. FIG. 12 is an enlarged view illustrating a portion of the electronic device 100 according to various embodiments of the present disclosure. FIG. 13 is a plane view illustrating a portion of the electronic device 100 according to various embodiments of the present disclosure.

According to various embodiments of the present disclosure, an enclosure member 401 of the electronic device 100 may include a molding enclosure 401a and frame members 401b where the frame members 401b may be coupled to a support member 403 received in the enclosure member 401.

Referring to FIGS. 10 to 13, the enclosure member 401 may include the molding enclosure 401a made of a non-conductive material and the frame members 401b made of a conductive material. The molding enclosure 401a has a shape in which both side ends are open, such that the frame members 401b may be coupled to the molding enclosure 401a to form both sidewalls of the enclosure member 401. The enclosure member 401 may receive the circuit board 104 and the support member 403. The circuit board 104 may be fixed between the support member 403 and the molding enclosure 401a. The frame members 401b may be coupled to both side ends of the support member 403 in a slide manner. According to various embodiments of the present disclosure, as best illustrated in FIG. 12, a guide rib 435 extending longitudinally may be formed at both side ends of the support member 403. Moreover, a guide groove 411 corresponding to the guide rib 435 may be formed on the inner surfaces of the respective frame members 401b. As the frame members 401b slide at both side ends of the support member 403 along a direction in which the guide groove 411 receives the guide rib 435, the frame members 401b may be coupled to both side ends of the support member 403, respectively. The support member 403 may be fixed to the molding enclosure 401a by using an engagement member such as a screw (not shown). As the support member 403 is fixed to the molding enclosure 401a, each of the frame members 401b may be coupled to a side end of the molding enclosure 401a to complete the enclosure member 401.

The support member 403 may be made of a conductive material such as metal to reinforce stiffness of the electronic device 100. In addition, the enclosure member 401 may be electrically connected to the circuit board 104 to provide grounding and shielding. By providing grounding and shielding with the use of the support member 403 made of the conductive material, the operation stability of the electronic device 100 may be improved.

The support member 403 may be partially made of a synthetic resin material. For example, in the current embodiment of the present disclosure, at least one of both ends (for example, a top end and a bottom end) of the support member 403 may be made of a synthetic resin material. If the support member 403 is formed of a combination of the conductive material and the synthetic resin material, as soon as a synthetic resin material portion (hereinafter, referred to as a 'second portion 433') of the support member 403 is molded by insert molding, the conductive material portion (hereinafter, referred to as a 'first portion 431') of the support member 403 may be coupled to the synthetic resin material portion. If the frame member 401b is formed of a conductive material such as metal and the first portion 431 of the support member 403 is also formed of the conductive material, then the second portion 433 of the support member 403 may be formed of the synthetic resin material such that the second portion 433 may provide the lubricity of a slide operation when the frame member 401b is slidably coupled to the support member 403.

According to various embodiments of the present disclosure, the electronic device 100 may stably maintain a state in which the frame member 401b is coupled to the support member 403. For example, as shown in FIG. 13, a binding protrusion 439 may be formed in the support member 403 and a biding groove 415 may be formed in the frame member 401b. When the frame member 401b is completely coupled to the support member 403, the binding protrusion 439 may be engaged with the binding groove 415 to completely fix the frame member 401b to the support member 403. When the binding protrusion 439 is not engaged with the binding groove 415, the frame member 401b may be deformed into a shape in which the guide groove 411 becomes wider. For example, if the binding protrusion 439 is not engaged with the binding groove 415 when the guide groove 411 at least partially receives the guide rib 435, then an inner wall of the guide groove 411 may be spaced apart from an outer circumferential surface of the guide rib 435. Hence, when the frame member 401b is slidably coupled to the support member 403, the frame member 401b may smoothly slide.

As mentioned previously, the support member 403 may be electrically connected to the circuit board 104 and the frame member 401b may be insulated from the support member 403 to block leakage current. For example, an insulator may be disposed between the frame member 401b and the support member 403 in a portion where the frame member 401b and the support member 403 are in direct contact. In the current embodiment, the portion where the frame member 401b and the support member 403 directly contact may include an outer circumferential surface of the guide rib 435 and an inner wall of the guide groove 411. Moreover, considering deformation caused by an external shock or the like, an insulator may be provided to a region adjacent to the portion in which the frame member 401b and the support member 403 directly contact each other.

Referring to FIG. 12, an insulator may be formed on the outer circumferential surface of the guide rib 435, a partial surface of the support member 403 adjacent to the outer circumferential surface, an inner wall of the guide groove 411, and a partial surface of the frame member 401b adjacent to the inner wall. The insulator may be implemented as insulation films 413 and 437 including painting, coating, anodizing, or the like. When the frame member 401b slides so as to be coupled to the support member 403, the binding protrusion 439 may come in contact with the frame member 401b as mentioned above. As the binding protrusion 439 contacts the frame member 401b, the guide groove 411 may become wider, thereby preventing the outer circumferential surface of the guide rib 435 and the inner wall of the guide groove 411 from directly rubbing together. For example, when the frame member 401b slides so as to be coupled to the support member 403, the direct friction is suppressed during sliding, thus preventing damage of the insulation film 413 and 437.

The binding protrusion 439 is engaged with the binding groove 415 to fix the frame member 401b to a predetermined position. When the binding member 439 is made of a conductive material, the binding member 439 may be a path for electrically connecting the frame member 401b with the support member 403. According to various embodiments of the present disclosure, the binding protrusion 439 may be formed in the second portion 433, for example, a non-conductive material portion of the support member 403, thereby blocking leakage current flowing to the frame member 401b.

Figure 14:
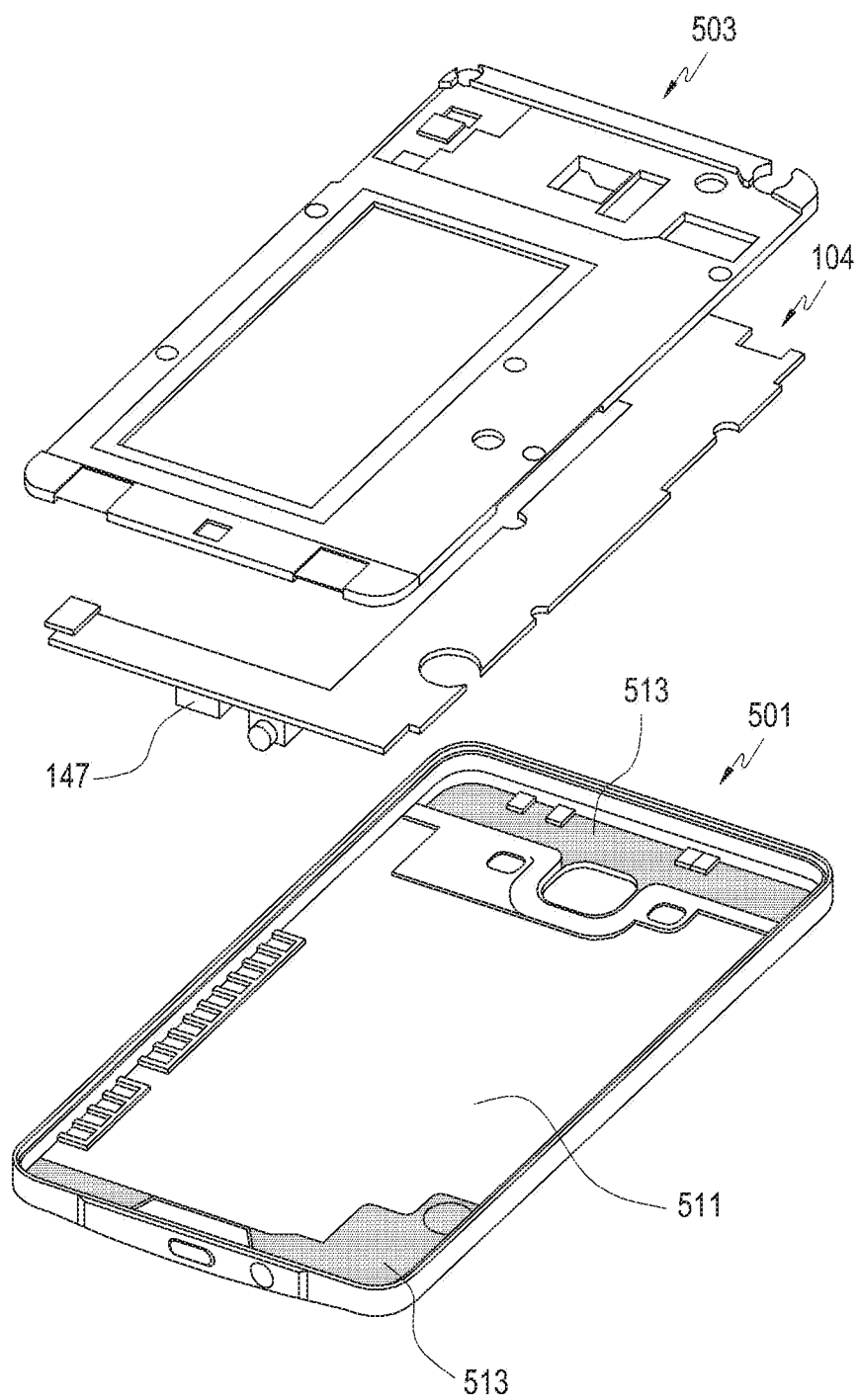
FIG. 14 is an exploded perspective view illustrating a portion of an electronic device according to various embodiments of the present disclosure.
Figure 15:
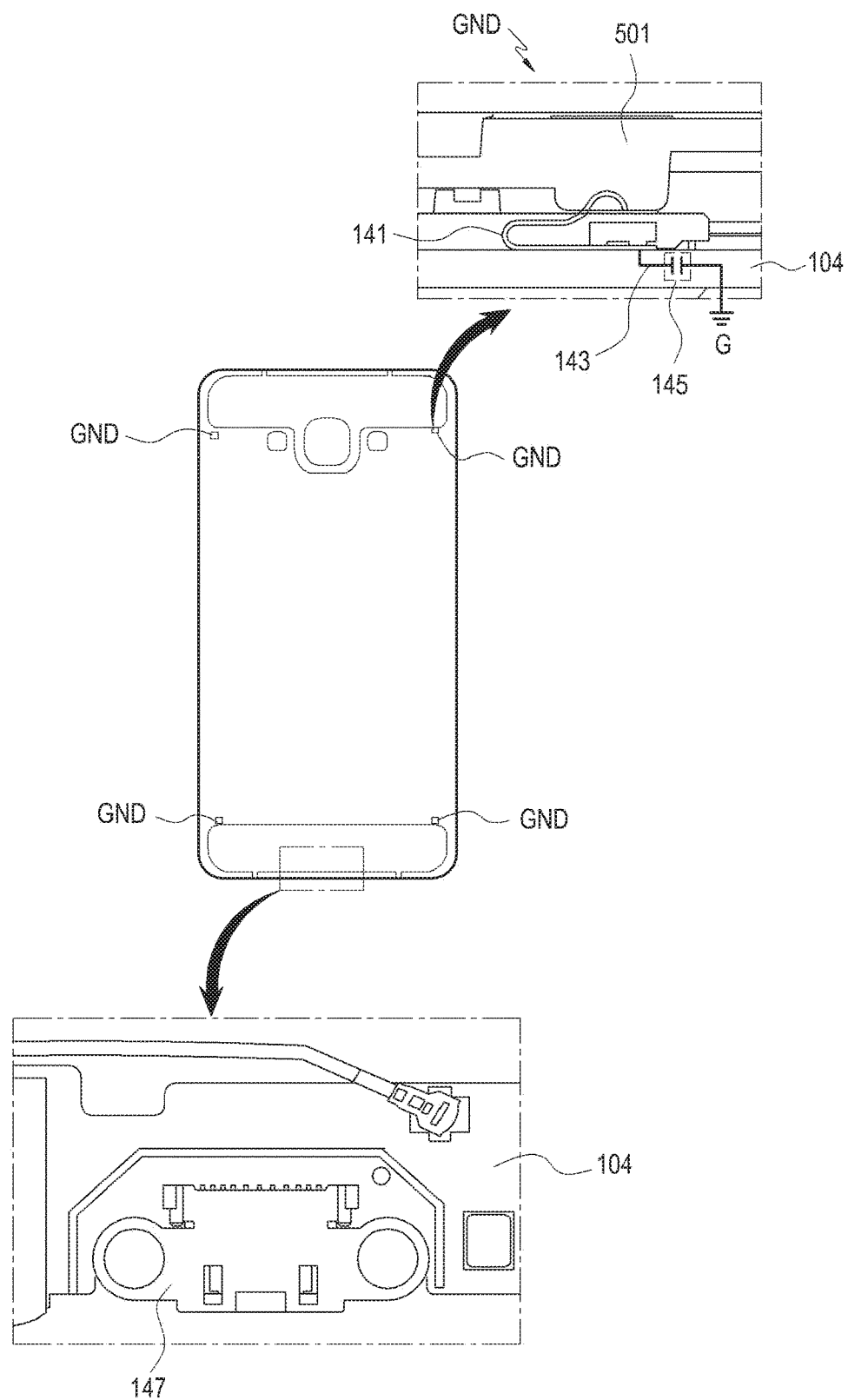
FIG. 15 is a plane view illustrating a portion of an electronic device according to various embodiments of the present disclosure.

FIG. 14 is an exploded perspective view illustrating a portion of an electronic device (for example, the electronic device 100) according to various embodiments of the present disclosure. FIG. 15 is a plane view illustrating a portion of an electronic device according to various embodiments of the present disclosure.

Referring to FIGS. 14 and 15, an enclosure member 501 may be formed of a conductive material. In various embodiments of the present disclosure, the enclosure member 501 formed of a conductive material may include an insulating layer 513 formed on an inner surface 511. The insulating layer 513 may be formed by painting, coating, anodizing, or the like. If the enclosure member 501 is made of a conductive material, for example, a metallic material to have sufficient stiffness, a support member 503 received in the enclosure member 501 may be formed of synthetic resin. If the support member 503 is formed of a synthetic resin material to have non-conductivity, a conductive layer may be formed on the surface of the support member 503 to improve the operation stability of the electronic device.

As the enclosure member 501 is made of a conductive material, grounding or shielding may be provided to circuit devices (for example, the circuit board 104) received in the electronic device by using the enclosure member 501. For example, by forming at least one ground structures GND for connecting the enclosure member 501 to a grounding portion G of the circuit board 104, the enclosure member 501 may provide grounding or shielding. When the enclosure member 501 is connected to the grounding portion G, a connection member 141 such as a C-clip is provided on the circuit board 104 to directly contact the enclosure member 501. The connection member 141 may be connected to the grounding portion G through a printed circuit pattern formed on the circuit board 104, for example, a grounding line 143.

If the enclosure member 501 is connected to the grounding portion G of the circuit board 104, leakage current from direct current may flow to the enclosure member 501. For example, when a charging plug is connected to a charging terminal 147 (for example, an interface connector) provided on the circuit board 104, the charging terminal 147 and the enclosure member 501 directly contact or direct current may be left in the enclosure member 501 from the circuit board 104 through a path for connecting the enclosure member 501 to the grounding portion G.

As mentioned above, the insulating layer 513 may be formed on the inner surface 511 of the enclosure member 501. When the circuit board 104 is mounted and fixed on the enclosure member 501, the charging terminal 147 may be positioned on the insulating layer 513. Thus, direct current flowing to the enclosure member 501 through the charging terminal 147 may be blocked by the insulating layer 513. According to various embodiments of the present disclosure, the grounding line 143, for example, a path for connecting the grounding portion G with the connection member 141 may include a capacitive element 145. The capacitive element 145 repeats charging and discharging by alternate current, but blocks direct current, thus preventing the direct current from being left in the enclosure member 501.

According to various embodiments of the present disclosure, the electronic device includes an enclosure member, at least a portion of which is formed of a conductive material and a support member which is received in the enclosure and at least a portion of which is formed of a conductive material, in which the conductive material portion of the enclosure member and the conductive material portion of the support member are insulated from each other.

According to various embodiments of the present disclosure, the enclosure member may include a molding enclosure which is formed of a non-conductive material to receive the support member and a frame enclosure which is formed of a conductive material to enclose at least a portion of an outer surface of the molding enclosure.

According to various embodiments of the present disclosure, the frame enclosure may be coupled to the molding enclosure into one piece by insert molding, and the molding enclosure may be interposed between the conductive material portion of the support member and the frame enclosure for insulation.

According to various embodiments of the present disclosure, the electronic device may further include a segment portion formed in the frame enclosure and a protruding portion formed in the molding enclosure to be disposed in the segment portion.

According to various embodiments of the present disclosure, the frame enclosure may be provided to enclose at least a side surface of the molding enclosure, and the frame enclosure may be assembled to a position spaced apart from the support member.

According to various embodiments of the present disclosure, at least a portion of the molding enclosure may be interposed between the frame enclosure and the support member.

According to various embodiments of the present disclosure, the conductive material portion of the enclosure member may be at least partially adjacent to the support member, and a portion of the support member, which is adjacent to the conductive material portion of the enclosure member, may be formed of a non-conductive material.

According to various embodiments of the present disclosure, the enclosure member may include four corners, and a portion of the conductive material portion of the enclosure member may be adjacent to a portion of the support member in at least one of the four corners.

According to various embodiments of the present disclosure, the enclosure member may include a molding enclosure coupled to face the support member and a frame member formed of a conductive material to be coupled to the support member and to form a sidewall of the molding enclosure in which the frame member is slidably coupled to the support member.

According to various embodiments of the present disclosure, the electronic device may further include a guide rib formed at both side ends of the support member and a guide groove extending longitudinally from an inner surface of the frame member, in which the guide groove slides in such a way to enclose the guide rib.

According to various embodiments of the present disclosure, an outer circumferential surface of the guide rib and an insulation film formed on an inner wall of the guide groove may insulate the support member from the frame member in which the outer circumferential surface of the guide rib and the inner wall of the guide groove at least contact each other.

According to various embodiments of the present disclosure, the insulation film may include painting, coating, or anodizing.

According to various embodiments of the present disclosure, the electronic device may further include a binding protrusion formed in the support member and a binding groove formed in the frame member, in which when the frame member is completely coupled to the support member, the binding protrusion is engaged to the binding groove to fix the frame member.

According to various embodiments of the present disclosure, when the frame member is slidably coupled to the support member, the binding protrusion may come in contact with the frame member.

According to various embodiments of the present disclosure, the electronic device may further include a circuit board received in the enclosure member, in which the conductive material part of the support member is connected to the circuit board to provide grounding of the circuit board.

According to various embodiments of the present disclosure, the electronic device may further include a connection member connected to a grounding portion of the circuit board and a capacitive element provided in a grounding line between the connection member and the grounding portion, in which the connection member contacts the conductive material portion of the enclosure member.

According to various embodiments of the present disclosure, the electronic device may further include a display device disposed on a surface of the support member and a circuit device disposed on the other surface of the support member.

Figure 16:
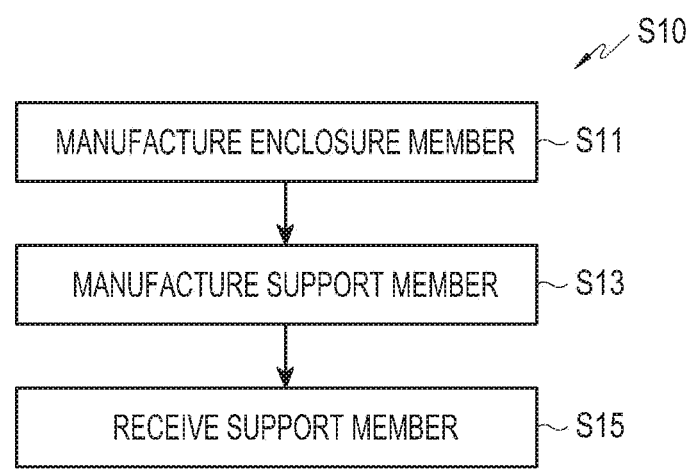
FIG. 16 is a flowchart illustrating a method for manufacturing an electronic device according to various embodiments of the present disclosure.

FIG. 16 is a flowchart illustrating a method S10 for manufacturing an electronic device according to various embodiments of the present disclosure.

When the method S10 for manufacturing an electronic device is described with reference to FIG. 16, a structure of the electronic device will be described using the structure of the electronic device 100 and reference numerals may be omitted.

Referring to FIG. 16, the method S10 may include an operation S11 of manufacturing an enclosure member, an operation S13 of manufacturing a support member, and an operation S15 of receiving the support member.

The operation S11 of manufacturing the enclosure member is a process of coupling the molding enclosure and the frame enclosure to each other, in which the enclosure member may be completed by insert or injection molding or assembly according to structures of the molding enclosure the frame enclosure. According to various embodiments of the present disclosure, the enclosure member may be made in such a way that at least a portion of the enclosure member, for example, the frame enclosure, may be formed of a conductive material such as metal. Another portion of the enclosure member, for example, the molding enclosure, may be formed of a non-conductive material such as synthetic resin.

If the frame enclosure is formed of a conductive material such as metal, the frame enclosure is manufactured first and then is inserted into a mold for molding the molding enclosure to form the molding enclosure, and at the same time, the molding enclosure and the frame enclosure are coupled to each other, thus completing the enclosure member. The molding enclosure and the frame enclosure may be separately manufactured, and then may be coupled through assembly to complete the enclosure member. A way to couple the frame enclosure to the molding enclosure may be properly selected, considering the specification or structure of each product.

In operation S13, the support member may be manufactured. Although operation S13 is performed in succession to operation S11 of manufacturing the enclosure member in FIG. 16, the enclosure member and the support member are manufactured independently such that an order of operations is not necessarily specified. For example, in independent processes, the enclosure member and the support member may be manufactured at the same time or the support member may be manufactured before the enclosure member. The support member may reinforce the stiffness of the electronic device 100, for example, the enclosure member, and support the circuit board or the display device received in the enclosure member. To reinforce the stiffness of the enclosure member, the support member may be at least partially formed of a metallic material, for example, a conductive material. The conductive material portion of the support member may be formed of die-casting or lathe machining, and for a non-conductive material portion such as synthetic resin other than the conductive material portion, the non-conductive material portion may be formed by insert molding in which the conductive material portion is inserted into a mold.

In operation S15, the support member may be received in the enclosure member. The support member is fixed in the enclosure member, in which the conductive material portion of the support member and the conductive material portion of the enclosure member may be insulated from each other. For example, a portion of the molding enclosure may be interposed between the conductive material portion of the support member and the frame enclosure.

According to various embodiments of the present disclosure, operations S11 and S15 may be performed at the same time according to the structures of the enclosure member and the support member. For example, in an embodiment disclosed in FIG. 10 among the above-described embodiments, the frame enclosure is slidably coupled to the support member, and the support member is coupled to the molding enclosure and at the same time, the frame enclosure is coupled to the molding enclosure. For example, although the method S10 is described in which operation S11 of manufacturing the enclosure member, operation S13 of manufacturing the support member, and operation S15 of receiving the support member are sequentially performed, an order of operations may be properly changed according to the structures of the enclosure member and the support member.

In the electronic device according to various embodiments of the present disclosure, at least a portion of the enclosure member forming the exterior is manufactured using a conductive material, for example, metal, thus making the exterior elegant and blocking an electric leakage to the conductive material portion because of being insulated from portions inside the enclosure member.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A portable communication device comprising:
   a display forming at least part of a front surface of the portable communication device;
   a circuit board disposed below the display, the circuit board including a capacitive element disposed therein and electrically coupled with a ground portion; and
   an enclosure at least partially accommodating the circuit board,
   wherein the enclosure including a cover member substantially parallel to the display and at least one frame member substantially perpendicular to the cover member,
   wherein the at least one frame member including a first conductive member and a second conductive member,
   wherein the first conductive member forming at least part of a first side of the portable communication device and the second conductive member electrically separated from the first conductive member and forming at least part of a second side of the portable communication device substantially perpendicular to the first side,
   wherein the first conductive member electrically coupled with the circuit board and adapted to function as at least part of a radiating element for an antenna of the portable communication device, and
   wherein the second conductive member electrically coupled with the ground portion via the capacitive element disposed in the circuit board such that a direct current between the second conductive member and the ground portion is at least partially interrupted by the capacitive element.

2. The portable communication device of claim 1, wherein the circuit board forms at least part of a printed circuit board including a printed circuit pattern formed thereon.

3. The portable communication device of claim 1, wherein the ground portion is formed in the circuit board.

4. The portable communication device of claim 1, wherein the cover member is in contact with the first conductive member.

5. The portable communication device of claim 1, wherein the cover member is in contact with the second conductive member.

6. The portable communication device of claim 1, wherein the enclosure further includes a molding enclosure disposed between the circuit board and the cover member.

7. The portable communication device of claim 6, wherein at least one ending portion of the molding enclosure is in contact with the second conductive member.

8. The portable communication device of claim 1, further comprising:
   a support member at least partially composed of a conductive material and disposed between the display and the circuit board.

9. The portable communication device of claim 1, further comprising:

a connection member disposed in the circuit board and electrically coupled with the capacitive member, wherein the second conductive member electrically coupled with the ground portion further via the connection member.

10. A portable communication device comprising:

a display;

a circuit board disposed below the display and including a capacitive element disposed therein; and an enclosure at least partially accommodating the circuit board, wherein the enclosure including a first conductive member and a second conductive member, wherein the first conductive member forming at least part of a first side of the portable communication device and the second conductive member electrically separated from the first conductive member and forming at least part of a second side of the portable communication device substantially perpendicular to the first side, wherein the first conductive member is adapted to electrically couple with the circuit board in such a way so as to function as a radiating element for an antenna of the portable communication device, and wherein the second conductive member is adapted to electrically couple with a ground portion via the capacitive element disposed in the circuit board.

11. The portable communication device of claim 10, wherein the second conductive member is electrically coupled with the ground portion via the capacitive element such that a direct current between the second conductive member and the ground portion is at least partially interrupted by the capacitive element.

12. The portable communication device of claim 10, wherein the ground portion is formed in the circuit board.

13. The portable communication device of claim 10, wherein the enclosure further includes a molding enclosure over which the circuit board is disposed, at least one ending portion of the molding enclosure in contact with the second conductive member.

14. The portable communication device of claim 13, wherein the molding enclosure is attached with the circuit board via a screw.

15. The portable communication device of claim 13, the enclosure further includes a cover member disposed below the molding enclosure, at least one ending portion of the cover member in contact with the second conductive member.

16. The portable communication device of claim 13, further comprising:

a support member disposed between the display and the circuit board, at least one ending portion of the support member in contact with the second conductive member and the molding enclosure.

17. The portable communication device of claim 16, wherein the support member includes a conductive portion and a non-conductive portion, and wherein the non-conductive portion of the support member disposed between the conductive portion of the support member and the second conductive member.

18. A portable communication device comprising:

a display;

a circuit board disposed below the display and including a capacitive element disposed therein; and an enclosure at least partially accommodating the circuit board, wherein the enclosure including a first conductive portion and a second conductive portion, wherein the first conductive portion forming at least part of a first side of the portable communication device and the second conductive portion electrically separated from the first conductive portion and forming at least part of a second side of the portable communication device substantially perpendicular to the first side, wherein the first conductive portion is adapted to electrically couple with the circuit board in such a way so as to function as a radiating element for an antenna of the portable communication device, and wherein the second conductive portion electrically coupled with a ground portion via the capacitive element disposed in the circuit board.

19. The portable communication device of claim 18, wherein the capacitive element is disposed in the circuit board such that a direct current between the second conductive portion and the ground portion is at least partially interrupted by the capacitive element.

20. The portable communication device of claim 18, further comprising:

a connection member disposed in the circuit board and electrically coupled with the capacitive member, wherein the second conductive portion electrically coupled with the ground portion further via the connection member.

* * * * *